United States Patent
Lin et al.

(10) Patent No.: US 10,128,175 B2
(45) Date of Patent: Nov. 13, 2018

(54) PACKAGING METHODS AND PACKAGED SEMICONDUCTOR DEVICES

(71) Applicant: Taiwan Semiconductor Manufacturing Company, Ltd., Hsin-Chu (TW)

(72) Inventors: Jing-Cheng Lin, Hsin-Chu (TW); Jui-Pin Hung, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 77 days.

(21) Appl. No.: 13/753,328

(22) Filed: Jan. 29, 2013

(65) Prior Publication Data

US 2014/0210081 A1    Jul. 31, 2014

(51) Int. Cl.
*H01L 23/498*    (2006.01)
*H01L 21/56*    (2006.01)
(Continued)

(52) U.S. Cl.
CPC ........ *H01L 23/498* (2013.01); *H01L 21/4857* (2013.01); *H01L 21/561* (2013.01); *H01L 21/568* (2013.01); *H01L 23/49816* (2013.01); *H01L 23/49822* (2013.01); *H01L 25/03* (2013.01); *H01L 25/16* (2013.01);
(Continued)

(58) Field of Classification Search
CPC .... H01L 21/4803–21/486; H01L 21/78; H01L 21/782; H01L 21/786; H01L 21/304; H01L 21/56; H01L 23/28; H01L 23/31; H01L 21/568; H01L 2224/04; H01L 2224/12; H01L 2224/26; H01L 2224/81009; H01L 2224/8119; H01L 2224/8134; H01L 2224/83009;
(Continued)

(56) References Cited

U.S. PATENT DOCUMENTS 5,334,804 A * 8/1994 Love .................... H01L 21/486
174/257
6,043,429 A * 3/2000 Blish, II ................ H01L 21/563
174/361
(Continued)

FOREIGN PATENT DOCUMENTS

CN    101159240 A    4/2008
CN    100530581 C    8/2009
TW    200837847 A    9/2008

OTHER PUBLICATIONS https://www.merriam-webster.com/dictionary/solder.*

*Primary Examiner* — David Zarneke
(74) *Attorney, Agent, or Firm* — Slater Matsil, LLP

(57) ABSTRACT

Packaging methods and packaged semiconductor devices are disclosed. In some embodiments, a method of packaging semiconductor devices includes forming first contact pads on a carrier, forming a wiring structure over the first contact pads, and forming second contact pads over the wiring structure. A first packaged semiconductor device is coupled to a first set of the second contact pads, and a second packaged semiconductor device is coupled to a second set of the second contact pads. The carrier is removed. The second packaged semiconductor device comprises a different package type than the first packaged semiconductor device.

20 Claims, 6 Drawing Sheets

(51) Int. Cl.
  *H01L 25/03*   (2006.01)
  *H01L 21/48*   (2006.01)
  *H01L 25/16*   (2006.01)
  *H01L 23/00*   (2006.01)
  *H01L 23/538*  (2006.01)

(52) U.S. Cl.
  CPC .......... *H01L 23/5389* (2013.01); *H01L 24/04* (2013.01); *H01L 24/05* (2013.01); *H01L 24/06* (2013.01); *H01L 24/10* (2013.01); *H01L 24/12* (2013.01); *H01L 24/13* (2013.01); *H01L 24/14* (2013.01); *H01L 24/81* (2013.01); *H01L 2224/131* (2013.01); *H01L 2224/16227* (2013.01); *H01L 2224/814* (2013.01); *H01L 2224/81005* (2013.01); *H01L 2224/81191* (2013.01); *H01L 2224/81815* (2013.01); *H01L 2924/00014* (2013.01); *H01L 2924/01322* (2013.01); *H01L 2924/12041* (2013.01); *H01L 2924/1461* (2013.01); *H01L 2924/15311* (2013.01); *H01L 2924/18161* (2013.01); *H01L 2924/19105* (2013.01)

(58) Field of Classification Search
  CPC ......... H01L 24/04–24/06; H01L 24/12–24/14; H01L 2224/81; H01L 2224/81909; H01L 24/10
  USPC .................... 438/125, 126, 127; 29/832, 852
  See application file for complete search history.

(56) References Cited

U.S. PATENT DOCUMENTS

| | | | |
|---|---|---|---|
| 6,043,563 A * | 3/2000 | Eldridge | G01R 31/2884 257/773 |
| 6,418,615 B1 * | 7/2002 | Rokugawa et al. | 29/852 |
| 6,458,682 B2 * | 10/2002 | Watanabe | H01L 21/0272 257/E21.025 |
| 6,603,210 B2 * | 8/2003 | Kishimoto et al. | 257/781 |
| 6,838,313 B2 * | 1/2005 | Kumamoto | H01L 21/4832 257/E21.503 |
| 7,008,867 B2 * | 3/2006 | Lei | H01L 24/03 257/E21.508 |
| 7,268,012 B2 * | 9/2007 | Jiang et al. | 438/106 |
| 7,598,117 B2 * | 10/2009 | Kurita et al. | 438/106 |
| 8,736,050 B2 * | 5/2014 | Huang | H01L 24/11 257/621 |
| 8,791,579 B2 * | 7/2014 | Lai | H01L 23/488 257/738 |
| 8,822,841 B2 * | 9/2014 | Lee | H01L 24/11 174/264 |
| 8,846,454 B2 * | 9/2014 | Shim et al. | 438/118 |
| 8,993,431 B2 * | 3/2015 | Hsu | H01L 24/11 438/613 |
| 9,024,431 B2 * | 5/2015 | Liu | H01L 23/48 257/692 |
| 9,082,649 B2 * | 7/2015 | Faust | H01L 21/76883 |
| 9,450,061 B2 * | 9/2016 | Lin | H01L 24/11 |
| 9,455,183 B2 * | 9/2016 | Hsiao | H01L 21/76885 |
| 2002/0151164 A1 * | 10/2002 | Jiang | H01L 24/03 438/613 |
| 2003/0011075 A1 * | 1/2003 | Ohuchi | H01L 21/486 257/774 |
| 2003/0052104 A1 * | 3/2003 | Matsumoto | C04B 35/185 219/121.81 |
| 2004/0166661 A1 * | 8/2004 | Lei | H01L 24/03 438/614 |
| 2005/0277228 A1 * | 12/2005 | Lee | H01L 21/4803 438/113 |
| 2007/0028445 A1 * | 2/2007 | Su | H01L 24/11 29/840 |
| 2007/0228567 A1 * | 10/2007 | Bauer | H01L 23/3142 257/739 |
| 2007/0267745 A1 * | 11/2007 | Chao | H01L 24/11 257/737 |
| 2008/0079163 A1 * | 4/2008 | Kurita | H01L 21/6835 257/759 |
| 2008/0081157 A1 * | 4/2008 | Schneegans | H01L 23/49575 428/189 |
| 2008/0258300 A1 * | 10/2008 | Kobayashi et al. | 257/737 |
| 2008/0316721 A1 * | 12/2008 | Maki | H01L 23/498 361/760 |
| 2009/0098724 A1 * | 4/2009 | Yu | H01L 24/03 438/614 |
| 2009/0267220 A1 * | 10/2009 | Kuhlman | H01L 23/3121 257/698 |
| 2010/0001400 A1 * | 1/2010 | Schmidt | H01L 24/05 257/751 |
| 2010/0065964 A1 * | 3/2010 | Naem | H01L 21/76852 257/737 |
| 2010/0164105 A1 * | 7/2010 | Onai | H01L 23/53238 257/751 |
| 2011/0001215 A1 | 1/2011 | Lam | |
| 2011/0291261 A1 * | 12/2011 | Fleischman | H01L 24/06 257/737 |
| 2013/0075937 A1 * | 3/2013 | Wang | H01L 25/0655 257/782 |
| 2013/0113099 A1 * | 5/2013 | Lim et al. | 257/738 |
| 2013/0115738 A1 * | 5/2013 | Wang et al. | 438/127 |
| 2013/0120947 A1 * | 5/2013 | Lin | 361/767 |
| 2013/0122700 A1 * | 5/2013 | Wu | H01L 21/6835 438/613 |
| 2013/0127059 A1 * | 5/2013 | Lai | H01L 23/488 257/773 |
| 2013/0134588 A1 * | 5/2013 | Yu | H01L 23/49811 257/738 |
| 2013/0161809 A1 * | 6/2013 | Chew et al. | 257/734 |
| 2013/0193570 A1 * | 8/2013 | Kuo | H01L 24/11 257/737 |
| 2013/0300002 A1 * | 11/2013 | Yokoyama | H01L 23/3135 257/787 |
| 2014/0353828 A1 * | 12/2014 | Edelstein | H01L 21/76885 257/751 |
| 2015/0194402 A1 * | 7/2015 | Hsu | H01L 24/11 257/737 |
| 2017/0179012 A1 * | 6/2017 | Shimodaira | H01L 23/49816 |

* cited by examiner

PACKAGING METHODS AND PACKAGED SEMICONDUCTOR DEVICES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) of integrated circuits by continual reductions in minimum feature size, which allow more components to be integrated into a given area. These smaller electronic components also require smaller packages that utilize less area than packages of the past, in some applications. In some applications, it is desirable to package integrated circuits having different functions together in a single package.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to the packaging of semiconductor devices. Novel methods of packaging together a plurality of packaged semiconductor devices will be described herein.

Figure 4:
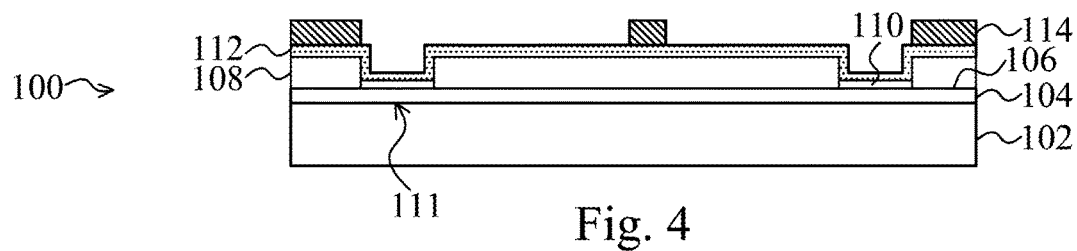
Figure 5:
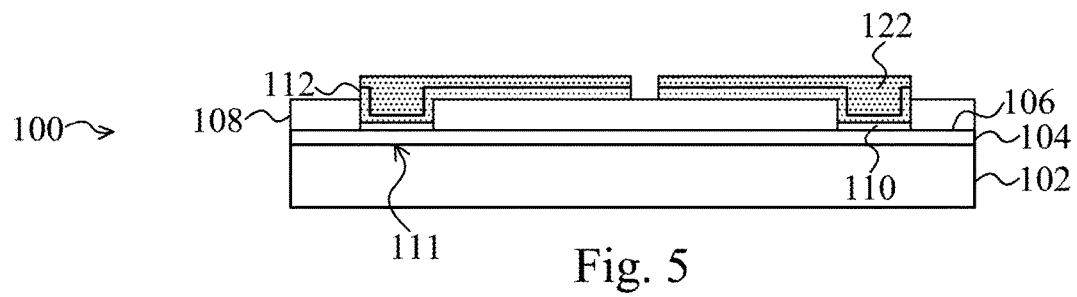
Figure 6:
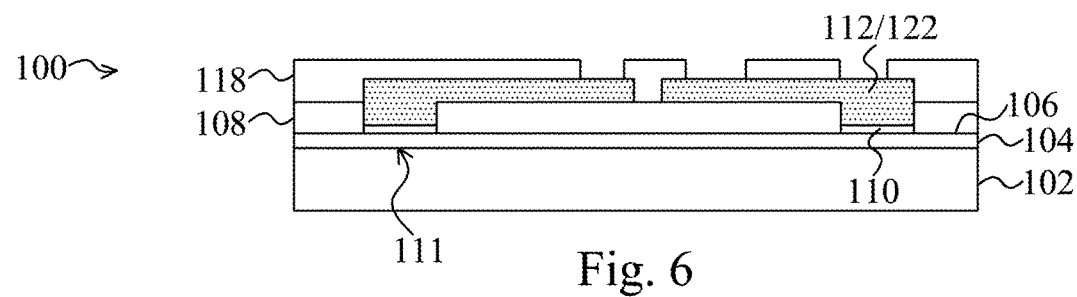
Figure 7:
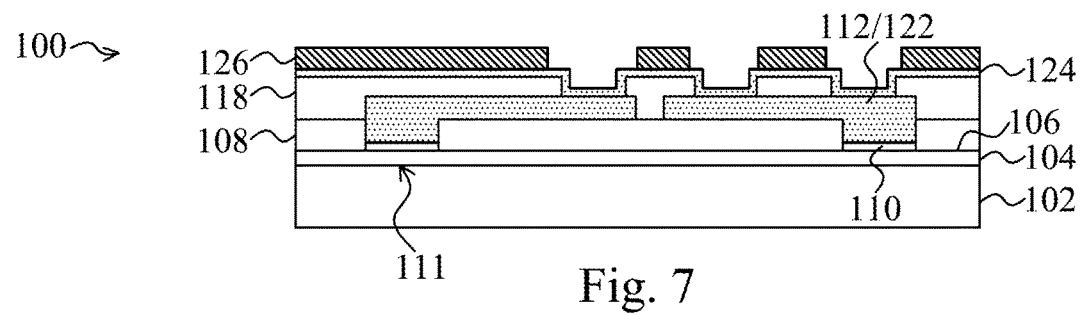
Figure 8:
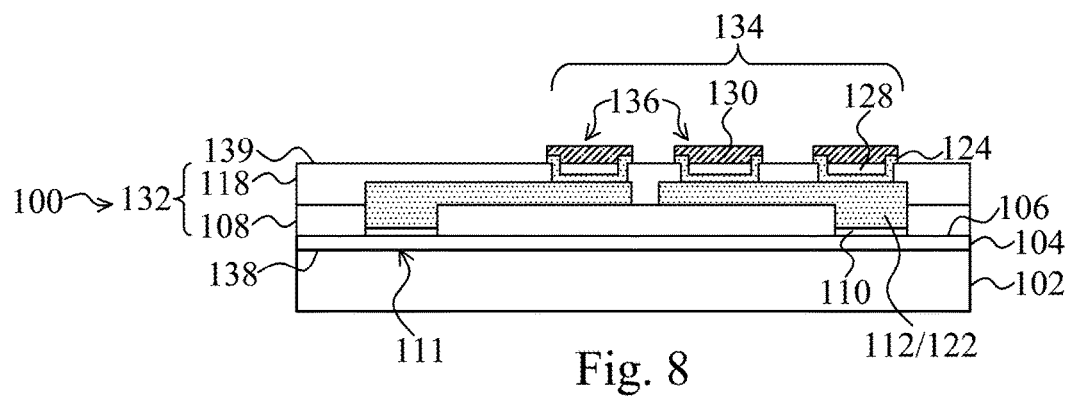
Figure 9:
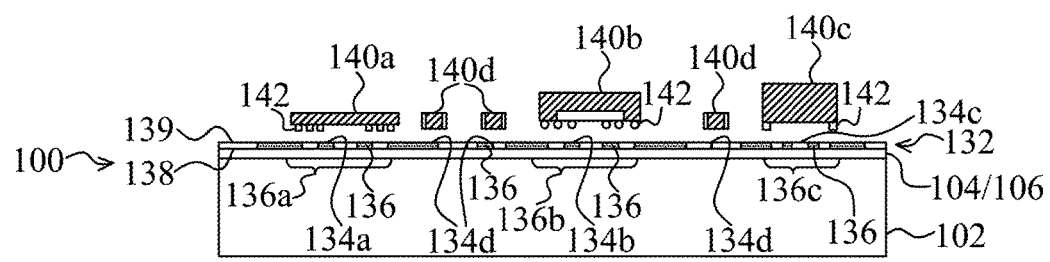
Figure 10:
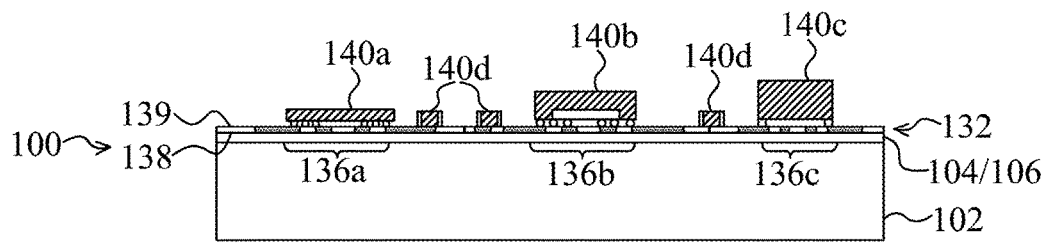

FIGS. 1 through 14 illustrate cross-sectional views of a method of packaging semiconductor devices in accordance with some embodiments of the present disclosure. To generally summarize the novel methods, first contact pads 111 are formed on a carrier 102, as shown in FIGS. 1 through 4. A wiring structure 112/122 is formed over the first contact pads 111, as shown in FIGS. 4 and 5. Second contact pads 136 are formed over the wiring structure 112/122, as shown in FIGS. 6 through 8. A first packaged semiconductor device 140a is coupled to a first set 136a of the second contact pads 136, and a second packaged semiconductor device 140b is coupled to a second set 136b of the second contact pads 136, as illustrated in FIGS. 9 and 10. The second packaged semiconductor device 140b comprises a different package type than the first packaged semiconductor device 140a.

Figure 11:
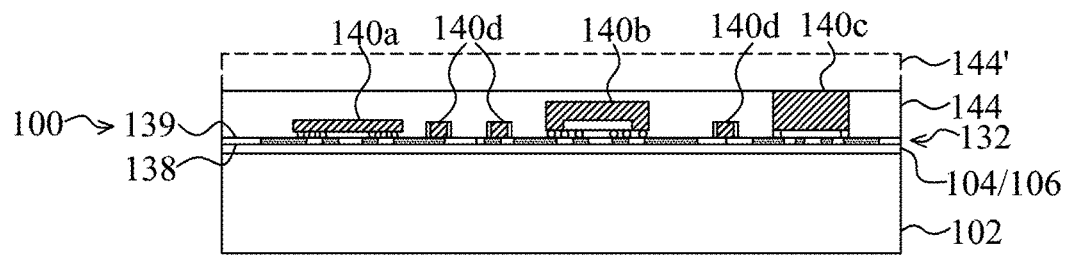
Figure 12:
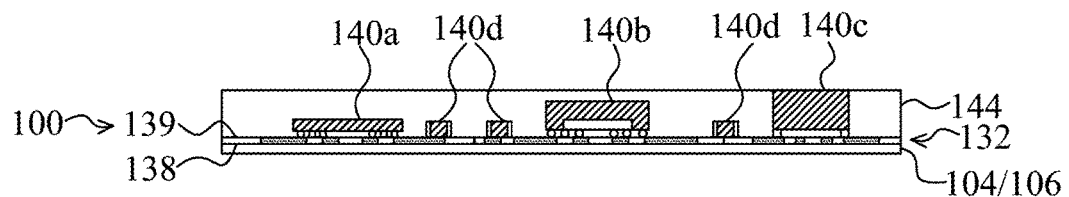
Figure 13:
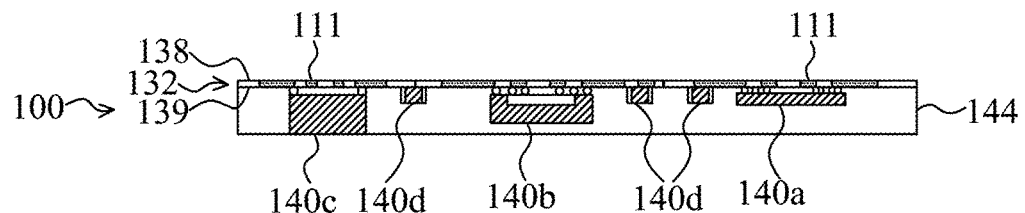
Figure 14:
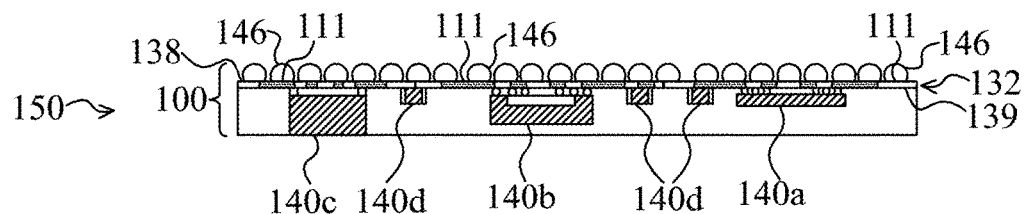

A molding compound 144 is formed over the packaged semiconductor devices 140a and 140b, as shown in FIG. 11, and the carrier 102 is removed, as shown in FIG. 12. An adhesive 104 and a seed layer 106 are removed from the packaging device 100 as shown in FIG. 13, and conductive balls 146 are formed on the first contact pads 111, as shown in FIG. 14. The novel packaging device 100 includes a redistribution layer 132 that includes the wiring structure 112/122. The novel packaging device 100 also includes the first contact pads 111, the second contact pads 136, the molding compound 144, and the conductive balls 146.

Manufacturing methods for the packaging device 100 in accordance with some embodiments will next be described in more detail. Referring again to FIG. 1, first, a carrier 102 is provided, as shown in FIG. 1. The carrier 102 may comprise a wafer comprising glass, silicon (e.g., a silicon wafer), silicon oxide, metal plate, or a ceramic material, as examples. An adhesive 104 is applied over the carrier wafer 100, also shown in FIG. 1. The adhesive 104 comprises an adhesion layer that may comprise foil, epoxy, silicone rubber, a polymer, and/or a metal, as examples, although other materials may also be used. The adhesive 104 comprises a die attach film (DAF) in some embodiments, as another example. The adhesive 104 may be formed on the carrier 102 by spin-coating, printing, chemical vapor deposition (CVD), or physical vapor deposition (PVD), as examples. If the adhesive 104 comprises a foil, the foil may be laminated onto the carrier 102, for example. The adhesive 104 is not included in some embodiments.

Figure 1:
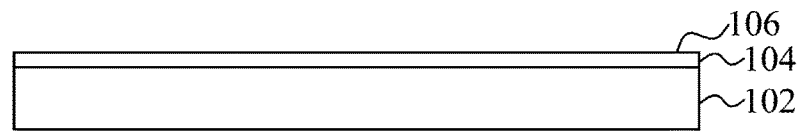
FIGS. 1 through 14 illustrate cross-sectional views of a method of packaging a plurality of packaged semiconductor devices in accordance with some embodiments of the present disclosure.

A first seed layer 106 is formed over the carrier 102, e.g., the first seed layer 106 is formed over the adhesive 104 disposed on the carrier 102, as shown in FIG. 1. If the adhesive 104 is not included, the first seed layer 106 is formed directly on the carrier 102, for example. The first seed layer 106 comprises about 0.3 μm of a material such as Ti, Cu, or a combination thereof deposited using PVD or by lamination of a foil material in some embodiments, for example. Alternatively, the first seed layer 106 may comprise other materials and dimensions and may be formed using other methods.

Figure 2:
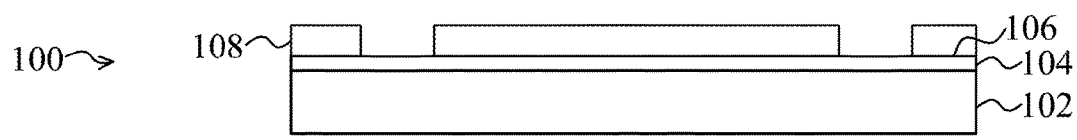

A first insulating material 108 is formed over the first seed layer 106, as shown in FIG. 2. The first insulating material 108 comprises about 7 μm of a polymer deposited using a spin coating process or a lamination process, as examples. Alternatively, the first insulating material 108 may comprise other materials and dimensions and may be formed using other methods.

The first insulating material 108 is patterned using a lithography process, also illustrated in FIG. 2. For example, a photoresist (not shown) may be formed over the first insulating material 108, and the photoresist is patterned by exposure to energy or light reflect from or transmitted through a lithography mask having a desired pattern thereon. The photoresist is developed, and exposed (or unexposed, depending on whether the photoresist is positive or negative) regions of the photoresist are removed using an ashing and/or etching process. The photoresist is then used as an etch mask during an etch process. Exposed portions of the first insulating material 108 are removed during the etch process. The photoresist is then removed.

The first insulating material 108 is patterned to define a pattern for a plurality of first contact pads 111 (see FIG. 3) that will be formed within the first insulating material 108 in some embodiments, for example. The patterns in the first insulating material 108 may comprise a width of about 180 μm to about 240 μm in some embodiments, for example. The patterns in the first insulating material 108 may comprise a shape of a square, rectangle, circle, oval, or other shapes in a top view, for example. Alternatively, the patterns in the first insulating material 108 may comprise other dimensions and shapes.

Figure 3:
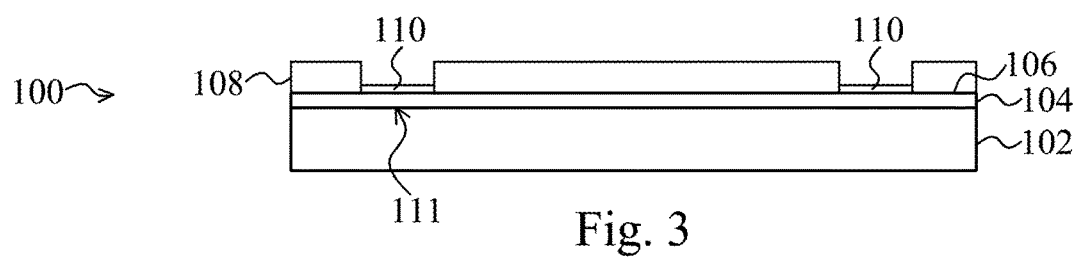

A first conductive material 110 is formed over the first seed layer 106 that is exposed through the patterns in the first insulating material 108, as shown in FIG. 3. The first conductive material 110 is formed on the first seed layer 106 using a plating process in some embodiments, for example. The plating process comprises an electro-chemical plating (ECP) process in some embodiments. An electro-less plating method may also be used to form the first conductive material 110 on the first seed layer 106, as another example. Alternatively, the first conductive material 110 may be formed using other methods. The first conductive material 110 comprises about 0.3 μm of a conductive material such as Ni or Sn in some embodiments, as examples. Alternatively, the first conductive material 110 may comprise other materials and dimensions and may be formed using other methods. The first conductive material 110 comprises the first contact pads 111. In some embodiments, plating the first conductive material 110 on the first seed layer 106 comprises forming the plurality of first contact pads 111, for example.

A second seed layer 112 is formed over the first conductive material 110 and over the patterned first insulating material 108, as shown in FIG. 4. The second seed layer 112 comprises about 0.3 μm of a conductive material such as TiCu deposited using PVD in some embodiments, as examples. Alternatively, the second seed layer 112 may comprise other materials and dimensions and may be formed using other methods.

A photoresist 114 is formed over the second seed layer 112, also shown in FIG. 4. The photoresist 114 is also referred to herein, e.g., in some of the claims, as a first layer of photoresist 114. The first layer of photoresist 114 is patterned to define a wiring structure 112/122 (see FIG. 5) in some embodiments, for example. In some embodiments, the first layer of photoresist 114 is patterned to define a wiring structure 112/122 of a redistribution layer (RDL) 132 (see FIG. 8) of the packaging device 100, for example. The portions of the first layer of photoresist 114 that are removed during the patterning process of the first layer of photoresist 114 define fan-out regions of the RDL 132 that provide horizontal connections within the packaging device 100 in some embodiments, for example.

Next, a second conductive material 122 is formed on exposed portions of the second seed layer 112 that are not covered by the first layer of photoresist 114, as shown in FIG. 5. The second conductive material 122 comprises about 7 μm of a conductive material such as Cu deposited using a plating process in some embodiments, as examples. The plating process comprises an ECP process or electro-less plating process in some embodiments, for example. Alternatively, the second conductive material 122 may comprise other materials and dimensions and may be formed using other methods.

The first layer of photoresist 114 is removed or stripped using an ashing and/or etch process, also shown in FIG. 5, leaving portions of the second seed layer 112 left remaining and exposed over top surfaces of the first insulating material 108 (not shown in FIG. 5; see FIG. 4). Portions of the second seed layer 112 that are exposed on the top surfaces of the first insulating material 108 are removed using an etch process, leaving unexposed portions of the second seed layer 112 left remaining beneath the second conductive material 122, as shown in FIG. 5. The second seed layer 112 comprises a material that can be etched selectively to the material of the second conductive material 122 in some embodiments, for example, so that the second seed layer 112 not covered by the second conductive material 122 is etched away during the etch process and the second conductive material 122 is left remaining. Alternatively, a top portion of the second conductive material 122 may be removed during the removal of exposed portions of the second seed layer 112, for example.

A second insulating material 118 is formed over the second conductive material 122 and the first insulating material 108, as shown in FIG. 6. The second insulating material 118 comprises about 10 μm of a polymer deposited using a spin coating process or a lamination process in some embodiments, as examples. Alternatively, the second insulating material 118 may comprise other materials and dimensions and may be formed using other methods.

Note that in FIGS. 6 through 8, for simplicity, the second seed layer 112 and the second conductive material 122 are shown as a single material layer 112/122. The second seed layer 112 and the second conductive material 122 comprise a wiring structure 112/122 comprising a plurality of straight and/or meandering traces in a top view. Straight portions of the wiring structure 112/122 may comprise substantially rectangular and elongated rectangular shapes in the top view, for example, not shown.

The second insulating material 118 is patterned using a lithography process, also illustrated in FIG. 6, using a lithography process similar to the lithography process described herein that is used to pattern the first insulating material 108. The second insulating material 118 is patterned to define a pattern for a plurality of second contact pads 136 (see FIG. 8) that will be formed within or within and over the second insulating material 118 in some embodiments, for example. The patterns in the second insulating material 118 may comprise a width of about 100 μm in some embodiments, for example. The patterns in the second insulating material 118 may comprise a shape of a square, rectangle, circle, oval, or other shapes in a top view, for example. Alternatively, the patterns in the second insulating material 118 may comprise other sizes and shapes.

A third seed layer 124 is formed over the patterned second insulating material 118 and exposed portions of the second conductive material 122, as shown in FIG. 7. The third seed layer 124 comprises about 0.3 μm of a conductive material such as TiCu deposited using PVD in some embodiments, as examples. Alternatively, the third seed layer 124 may comprise other materials and dimensions and may be formed using other methods. The third seed layer 124 comprises an under-ball metallization (UBM) seed layer in some embodiments, as another example.

A layer of photoresist 126 is formed over the third seed layer 124, also shown in FIG. 7. The layer of photoresist 126 is also referred to herein as a second layer of photoresist. The second layer of photoresist 126 is patterned using lithography to further define the pattern for the plurality of second contact pads 136. The patterns in the second insulating material 118 define a first portion of the patterns for the plurality of second contact pads 136, and the patterns in the second layer of photoresist 126 define a second portion of the patterns for the plurality of second contact pads 136 in some embodiments, for example.

The patterns in the second layer of photoresist 126 are slightly larger than the patterns in the second insulating material 118 in some embodiments, as illustrated in FIG. 7. Alternatively, the patterns in the second layer of photoresist 126 can be substantially the same as, or smaller than, the patterns in the second insulating material 118 in other embodiments, not shown.

Next, a third conductive material 128/130 is formed on exposed portions of the third seed layer 124 to form the plurality of second contact pads 136 in a packaged semiconductor device mounting region 134 of the packaging device 100, as shown in FIG. 8. The third conductive material 128/130 is formed using at least one plating process in some embodiments, for example. The third conductive material 128/130 comprises a first layer 128 of solder comprising a thickness of about 7 µm and a second layer 130 of Ni comprising a thickness of about 0.3 µm in some embodiments, as examples. Alternatively, the third conductive material 128/130 may comprise other materials and dimensions and may be formed using other methods. In some embodiments, the third conductive material 128/130 comprises a single layer of solder, as another example. In other embodiments, at least a top layer 130 of the third conductive material 128/130 comprises solder or other eutectic material, so that a reflow process may be used to attach packaged semiconductor devices 140a, 140b, 140c, and 140d (see FIGS. 9 and 10) to the second contact pads 136 comprising the third conductive material 128/130, for example.

After the formation of the third conductive material 128/130, the second layer of photoresist 126 (see FIG. 7) is removed or stripped, leaving portions of the third seed layer 124 remaining on the top surfaces of the second insulating material 118. Portions of the third seed layer 124 are left exposed (not shown in the drawings) on the top surfaces of the second insulating material 118 after the second layer of photoresist 126 is removed, for example. The exposed portions of the third seed layer 124 are then removed using an etch process, as shown in FIG. 8. A portion of the third conductive material 128/130 may, or may not be, removed during the removal of the exposed portion of the third seed layer 124, for example.

The second contact pads 136 include the third conductive material 128/130 and the third seed layer 124. The second contact pads 136 are formed over portions of the second conductive material 122 (e.g., over portions of the second seed layer and second conductive material 112/122).

The packaging device 100 includes an RDL 132 that includes wiring 112/122 that provides horizontal electrical connections between the first contact pads 111 and the second contact pads 136. The first contact pads 111 are disposed on a first side 138 of the RDL 132, and the second contact pads 136 are disposed on a second side 139 of the RDL 132 that is opposite the first side 138. In some embodiments, the second contact pads 136 and portions of the RDL 132 comprise a UBM structure, for example. The wiring structure 112/122 of the RDL 132 in some embodiments also provides horizontal electrical connections between packaged semiconductor devices 140a, 140b, 140c, and 140d (see FIG. 9) that are later attached to the packaging device 100.

Forming the packaging device 100 and RDL 132 effectively comprises reconstructing a wafer, e.g., comprising the various components 104, 106, 108, 110, 112/122, 118, 124, 128/130 illustrated in FIG. 8 disposed over the carrier 102. The methods of forming the RDL 132 described herein are examples; alternatively, the RDL 132 may be formed using other methods. The wiring structure 112/122, first contact pads 111, and second contact pads 136 may be formed using one or more single or dual damascene techniques by patterning the insulating materials 108 and/or 118, and filling the patterns with a conductive material. Or, the wiring structure 112/122, first contact pads 111, and second contact pads 136 may be formed using one or more subtractive etch processes, and the insulating materials 108 and/or 118 may be formed over the wiring structure 112/122, first contact pads 111, and/or second contact pads 136 after each subtractive etch process, for example. Combinations of damascene and subtractive methods of forming the wiring structure 112/122, first contact pads 111, and/or second contact pads 136 may also be used.

Next, a plurality of packaged semiconductor devices 140a, 140b, 140c, and 140d is attached to the second contact pads 136, as shown in FIGS. 9 and 10. Only six packaged semiconductor devices 140a, 140b, 140c, and 140d are shown in FIGS. 9 through 14; however, dozens or more packaged semiconductor devices 140a, 140b, 140c, and 140d may be attached to the second contact pads 136 of the packaging device 100. Contacts 142 of the packaged semiconductor devices 140a, 140b, 140c, and 140d are attached to the second contact pads 136 using a pick-and-place machine, manually, or other methods.

At least two of the packaged semiconductor devices 140a, 140b, 140c, and 140d comprise different package types in accordance with some embodiments of the present disclosure. One or several of the packaged semiconductor devices 140a, 140b, 140c, and 140d comprises a heterogeneous package type with respect to others of the packaged semiconductor devices 140a, 140b, 140c, and 140d in accordance with some embodiments, for example. The packaged semiconductor devices 140a, 140b, 140c, and 140d may include semiconductor devices such as integrated circuits, a plurality of integrated circuits, a system-in-a-package (SiP), SiP modules, discrete passive devices, microelectromechanical systems (MEMS's), functional modules, and/or combinations thereof, as examples, in some embodiments. In the embodiment shown in FIGS. 9 through 14, packaged semiconductor device 140a comprises a wafer level chip scale package (WLCSP), packaged semiconductor device 140b comprises a ball grid array (BGA) package, packaged semiconductor device 140c comprises a quad flat no-leads (QFN) package, and packaged semiconductor devices 140d comprise surface mount devices (SMD's), for example. The packaged semiconductor devices 140a, 140b, 140c, and 140d may alternatively comprise other package types, such as a package-on-package (PoP), a thin small outline package (TSOP), and/or a land grid array (LGA) package, for example.

Contacts 142 of packaged semiconductor device 140a are coupled to a set 136a of second contacts 136 in a packaged semiconductor device mounting region 134a of the packaging device 100. Contacts 142 of packaged semiconductor device 140b are coupled to a set 136b of second contacts 136 in a packaged semiconductor device mounting region 134b of the packaging device 100. Likewise, contacts 142 of packaged semiconductor device 140c are coupled to a set 136c of second contacts 136 in a packaged semiconductor device mounting region 134c of the packaging device 100, and contacts of packaged semiconductor devices 140d are coupled to sets 136d of second contacts 136 in packaged semiconductor device mounting regions 134d of the packaging device 100. The sets 136a, 136b, 136c, and 136d of the second contacts 136 of the packaging device 100 are arranged in accordance with the footprint of the contacts 142 disposed on each of the packaged semiconductor devices 140a, 140b, 140c, and 140d, for example.

In some embodiments, packaged semiconductor device 140a comprises a first packaged semiconductor device, and packaged semiconductor device 140b comprises a second packaged semiconductor device. The first packaged semiconductor device 140a is coupled to a first set 136a of a plurality of the second contact pads 136, and the second packaged semiconductor device 140b is coupled to a second set 136b of a plurality of the second contact pads 136. The second packaged semiconductor device 140b comprises a different package type than the first packaged semiconductor device 140a.

In some embodiments, packaged semiconductor device 140c comprises a third packaged semiconductor device. The third packaged semiconductor device 140c is coupled to a third set 136c of a plurality of the second contact pads 136. The third packaged semiconductor device 140c comprises a different package type than the first packaged semiconductor device 140a in some embodiments. In some embodiments, the third packaged semiconductor device 140c also comprises a different package type than the second packaged semiconductor device 140b. Alternatively, the third packaged semiconductor device 140c may comprise a different package type than the first packaged semiconductor device 140a or the second packaged semiconductor device 140b. In other embodiments, the third packaged semiconductor device 140c may comprise the same package type as the first packaged semiconductor device 140a or the second packaged semiconductor device 140b, as another example.

In other embodiments, packaged semiconductor devices 140c and 140d comprise a plurality of third packaged semiconductor devices. Each of the plurality of the third packaged semiconductor devices 140c and 140d is coupled to one of a plurality of third sets 136c and 136d, respectively, of a plurality of the second contact pads 136, in some embodiments.

After the packaged semiconductor devices 140a, 140b, 140c, and 140d are coupled to or attached to second contacts 136 of the packaging device 100, a eutectic material or solder of the second contacts 136 is reflowed to electrically and mechanically bond the packaged semiconductor devices 140a, 140b, 140c, and 140d to the second contacts 136. In some embodiments, the packaged semiconductor devices 140a, 140b, 140c, and 140d comprise "known good package dies" that have been functionally tested, for example. In some embodiments, after the solder or eutectic material reflow process of the second contacts 136, a circuit probing (CP) test is performed on the packaging device 100 and/or the packaged semiconductor devices 140a, 140b, 140c, and 140d, as another example.

A molding compound 144 is formed over the packaged semiconductor devices 140a, 140b, 140c, and 140d, as shown in FIG. 11. The molding compound 144 is formed over the packaged semiconductor devices 140a, 140b, 140c, and 140d and over exposed portions of the second insulating material 118 (not shown in FIG. 11; see FIG. 8) and the RDL 132. The molding compound 144 may comprise compression molding and may comprise epoxy, rubber, or polyimide (PI) in some embodiments, for example, although the molding compound 144 may alternatively comprise other materials. The molding compound 144 fills spaces between the packaged semiconductor devices 140a, 140b, 140c, and 140d. After forming the molding compound 144, a portion of the molding compound 144 may be formed over top surfaces of the packaged semiconductor devices 140a, 140b, 140c, and 140d, as shown in dashed lines at 144'.

In some embodiments, before the molding compound 144 is applied, an underfill material (not shown in the drawings) may be disposed under one or more of the packaged semiconductor devices 140a, 140b, 140c, and 140d. The underfill material may applied using a dispensing needle or by other devices or methods. The underfill material may comprise an epoxy or polymer comprising a liquid when applied that flows beneath the packaged semiconductor devices 140a, 140b, 140c, and 140d between the contacts 142 and portions of the second contact pads 136. The underfill material may then be cured using heat to form a solid. Alternatively, the underfill material may comprise other materials and may be applied and cured using other methods. The underfill material is not included in some embodiments.

Next, in some embodiments, a top portion of the molding compound 144 is removed to expose a top surface of packaged semiconductor device 140c having the greatest thickness. In some embodiments, a top portion of the molding compound 144 is not removed. The packaging device 100 shown in FIG. 11 may be exposed to one or more grinding processes, etch processes, polishing processes, and/or chemical-mechanical polishing (CMP) processes to remove a top portion of the molding compound 144 and reduce a thickness of the molding compound 144, as examples. The grinding process or other removal process may be adapted to stop on a top surface of the tallest packaged semiconductor device 140a, 140b, 140c, or 140d in some embodiments, for example.

In other embodiments, the molding compound 144 as applied just reaches a top surface of the tallest packaged semiconductor device 140c, or the molding compound 144 as applied does not reach a top surface of the tallest packaged semiconductor device 140c, for example. In such embodiments, a grinding process of the molding compound 144 is not included in the packaging process flow.

After the molding compound 144 is formed, the carrier 102 is removed, as shown in FIG. 12. The carrier 102 may be de-bonded or removed by prying the carrier 102 away from the RDL 132 with or without the use of an assist tool, for example. The adhesive 104 and seed layer 106 are also removed, as shown in FIG. 13. The adhesive 104 may be removed using a cleaning process, and the seed layer 106 may be removed using an etch process, as examples. The packaging device 100 may be inverted prior to the cleaning process and/or etch process to remove the adhesive 104 and seed layer 106, as illustrated in FIG. 13. The carrier 102, adhesive 104, and seed layer 106 may alternatively be removed using other methods.

In some embodiments, conductive balls 146 are then formed over the first contact pads 111 on the first side 138 of the RDL 132, as shown in FIG. 14. A completed packaged semiconductor device 150 is shown in FIG. 14 that includes the packaged semiconductor devices 140a, 140b, 140c, and 140d and the packaging device 100. In some embodiments, the first contact pads 111 and portions of the RDL 132 comprise a UBM structure, for example. The conductive balls 146 are formed on the first contact pads 111 that are disposed over and are electrically connected to the RDL 132, as shown in FIG. 14. The conductive balls 146 may comprise solder and/or other metals and may comprise a plurality of conductive bumps. The conductive balls 146 may comprise controlled collapse chip connection (C4) bumps in some embodiments, for example. The conductive balls 146 are coupled to the wiring 112/122 of the RDL 132 by the first contact pads 111. The conductive balls 146 may be directly mounted using a ball mount process and may subsequently be tested, for example. The conductive balls 146 may comprise solder balls of a ball grid array (BGA) in some embodiments. The footprint of the first contact pads 111 may be arranged in a BGA, for example.

Figure 15:
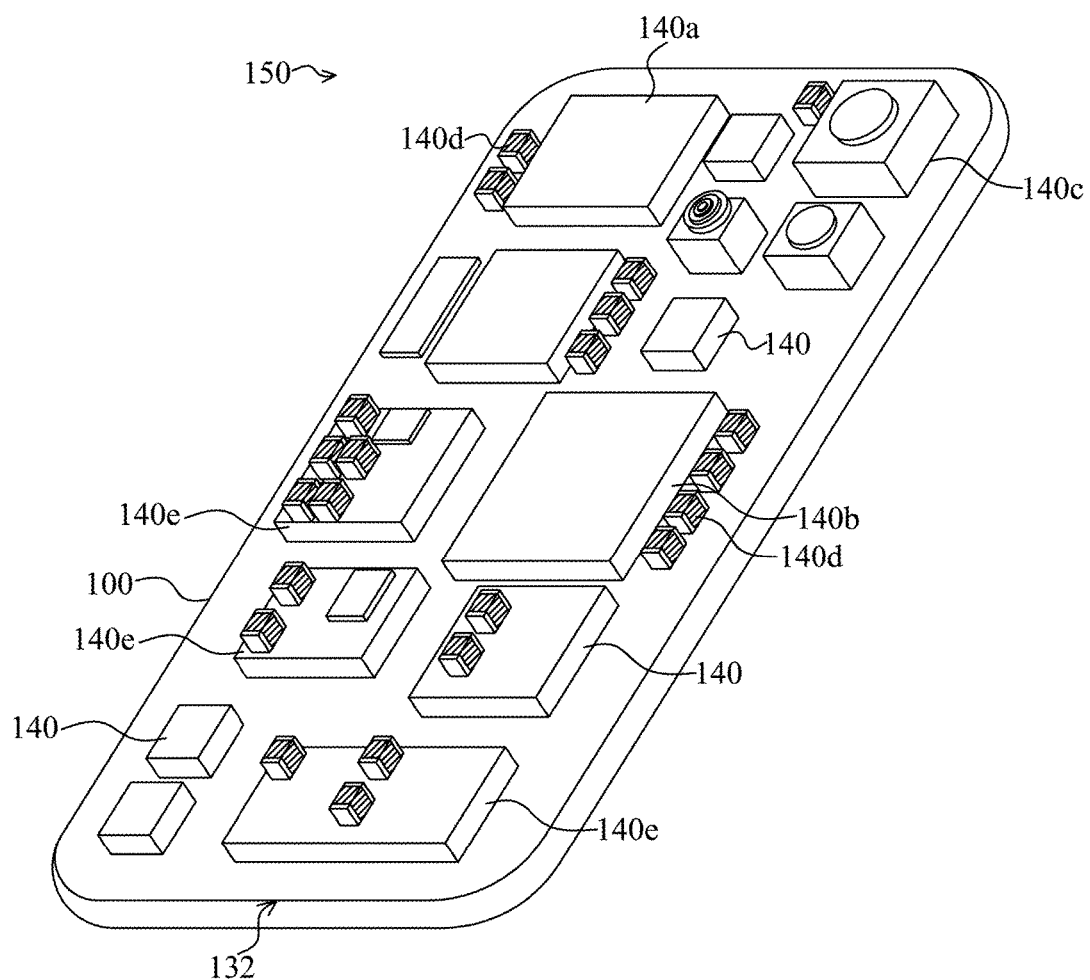
FIG. 15 is a perspective view of a packaged semiconductor device in accordance with some embodiments.

A portion of one packaging device 100 is shown in FIGS. 1 through 14; however, one or more packaging devices 100 may be simultaneously formed over a surface of the carrier 102 in accordance with some embodiments. In embodiments wherein two or more packaging devices 100 are formed on a single carrier 102, after the manufacturing process for the packaging device 100 and the packaging process for the packaged semiconductor devices 140a, 140b, 140c, and 140d are completed and the carrier 102 is removed, the packaging devices 100 and packaged semiconductor devices 150 may be singulated at singulation lines using a saw, forming packaged semiconductor devices 150, as shown in FIG. 15 in a perspective view. The packaged semiconductor device 150 may then be coupled to a printed circuit board (PCB), to another packaged integrated circuit, to an electrical or mechanical module, or other devices or end applications using the conductive balls 146 (see FIG. 14) of the packaged semiconductor devices 150.

Alternatively, in other embodiments, the conductive balls 146 are not included on the packaging device 100 or the packaged semiconductor device 150, and the first contact pads 111 are coupled to an end application using conductive balls or other types of connections that are provided on the end application, for example.

The edges of the packaged semiconductor device 150 may be shaped as appropriate to fit into an end application. For example, the corners are rounded on the packaged semiconductor device 150 shown in FIG. 15. The packaged semiconductor device 150 can be sized and shaped to fit into a particular shape of casing in an end application, such as a casing for a mobile phone, laptop, electronic tablet, or other electronic applications, as examples.

FIG. 15 also illustrates a variety of different package types of packaged semiconductor devices 140, 140a, 140b, 140c, 140d, and 140e that may be packaged using the novel packaging devices 100 and methods described herein. For example, packaged semiconductor devices 140a, 140b, 140c, and 140d are packaged using the package types described for FIGS. 9 and 10. Packaged semiconductor devices 140e include vertically stacked semiconductor devices.

The packaged semiconductor devices 140, 140a, 140b, 140c, 140d, and 140e may comprise a variety of electrical functions. Some examples of types of functions, circuitry, and packages of the packaged semiconductor devices 140, 140a, 140b, 140c, 140d, and 140e include digital SiP's, radio frequency (RF) SiP's, sensor SiP's, mixed signal SiP's, integrated circuits, drivers, electrostatic discharge (ESD) and/or electromagnetic interference (EMI) protection circuits, direct current (DC)/DC converters, SiP's with chip embedded technology, discrete passive devices, Bluetooth™ modules, television (TV) modules, amplitude and/or frequency modulation (AM and/or FM) modules, global positioning system (GPS) modules, baseband modules, camera modules, cellular radio modules, audio modules, power management modules, central processing unit (CPU) modules, wireless local area network (WLAN) modules, integrated passive device (IPD) modules, IPD network modules, light emitting diode (LED) flash modules, graphics processing unit (GPU) modules, and/or visual processing unit (VPU) modules, as examples. Alternatively, the packaged semiconductor devices 140, 140a, 140b, 140c, 140d, and 140e may comprise other types of functions, circuitry, and packages, depending on the end application of the packaged semiconductor device 150.

Figure 16:
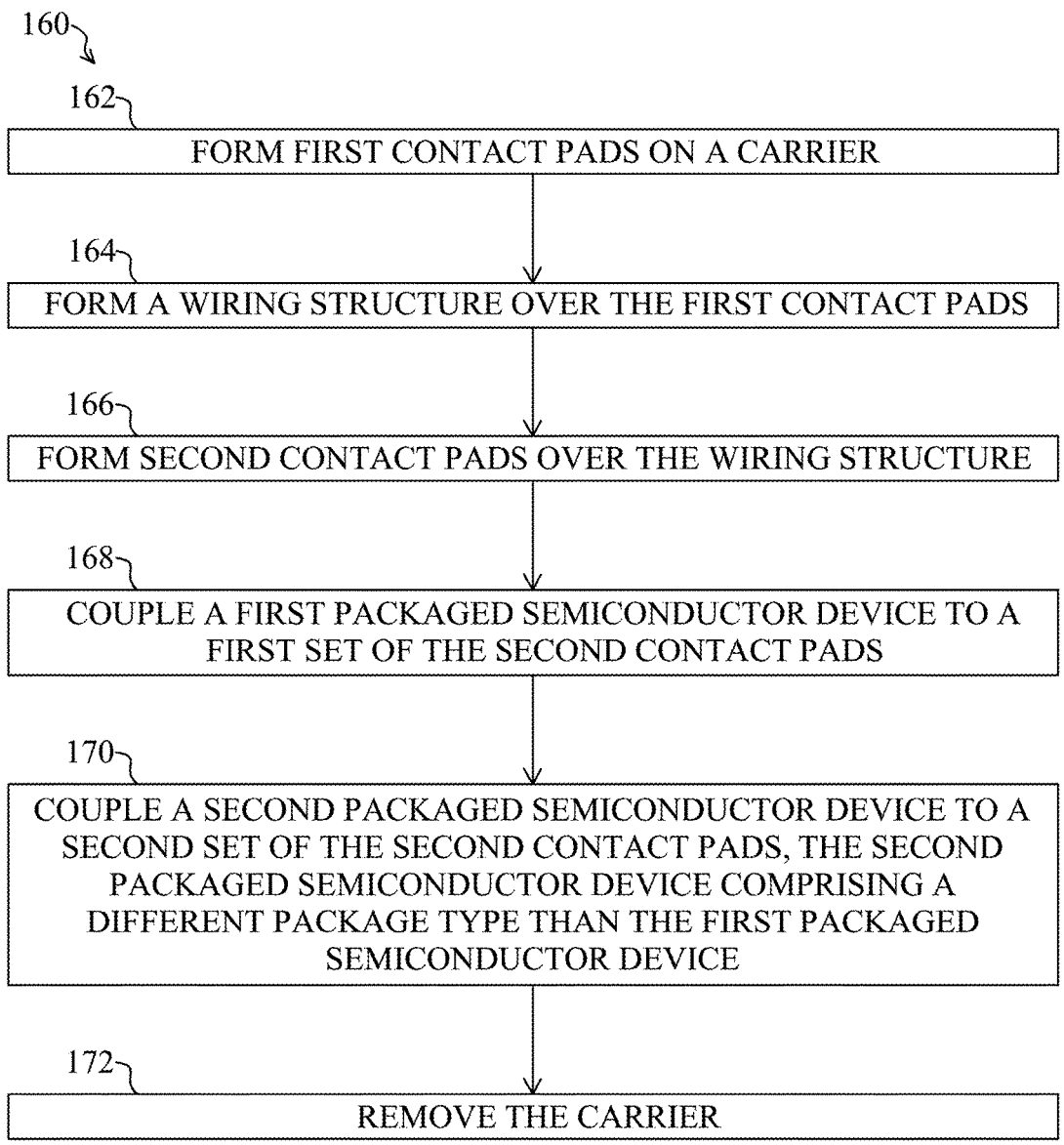
FIG. 16 is a flow chart illustrating a method of packaging semiconductor devices in accordance with some embodiments.

FIG. 16 is a flow chart 160 of a method of packaging semiconductor devices in accordance with some embodiments. In step 162, a plurality of first contact pads 111 is formed on a carrier 102, and in step 164, a wiring structure 112/122 is formed over the plurality of first contact pads 111. In step 166, a plurality of second contact pads 136 is formed over the wiring structure 112/122. In step 168, a first packaged semiconductor device 140a is coupled to a first set 136a of the plurality of second contact pads 136. In step 170, a second packaged semiconductor device 140b is coupled to a second set 136b of the plurality of second contact pads 136. The second packaged semiconductor device 140b comprises a different package type than the first packaged semiconductor device 140a. In step 172, the carrier 102 is removed.

Embodiments of the present disclosure include methods of packaging semiconductor devices, and also include packaged semiconductor devices 150 that have been packaged using the methods described herein. Embodiments of the present disclosure also include packaging devices 100 that have been manufactured using the methods described herein.

Advantages of embodiments of the disclosure include providing novel methods of packaging semiconductor devices. The packaging methods comprise heterogeneous package RDL-first (e.g., the RDL 132 is formed before the packaged semiconductor devices 140, 140a, 140b, 140c, 140d, and 140e are attached) packaging processes that provide integrated fan-out for multiple packaged semiconductor devices 140, 140a, 140b, 140c, 140d, and 140e. The novel methods are easily implementable in packaging and manufacturing process flows.

Multiple packaged semiconductor devices 140, 140a, 140b, 140c, 140d, and 140e, at least some of which are packaged in different types of packages, are packaged together by mounting them on an RDL 132 that is formed on a carrier 102, which provides the ability to effectively create a wafer or workpiece by forming the first contact pads 111, the wiring structure 112/122, the second contact pads 136, and the molding compound 144 over the carrier 102. Using the carrier 102 and the packaged semiconductor devices 140, 140a, 140b, 140c, 140d, and 140e, the packaging device 100 can be manufactured using processes similar to methods used in the semiconductor industry to process bulk semiconductor wafers. Embodiments described herein employ chip redistribution and molding technology to effectively form a new wafer using the carrier wafers 102, enlarging the chip area for the RDL 132 layout. The carrier 102 comprises a sacrificial component that is later removed, before singulating the packaged semiconductor devices 150.

The novel packaging methods described herein advantageously do not require a substrate, which saves time, expense, space, and weight. The thickness of the packages is minimized because a substrate is not included. The packaging methods are highly reliable because there is no coefficient of thermal expansion (CTE) mismatch concern (because there is no substrate), and the packaging methods have low manufacturing costs and high yields. The RDL's 132 provide high speed connections between the packaged semiconductor devices because a length of wiring structures 112/122 of the RDL 132 is minimized. A larger number of integrated circuits and functional modules (e.g., the packaged semiconductor devices 140, 140a, 140b, 140c, 140d, and 140e) can be integrated together to form smaller packaged semiconductor devices 150. The packaging devices 100 have a small form factor package which allows an increased distribution of battery space elsewhere in the end application and smaller printed circuit board (PCB) sizes, which is particularly advantageous in mobile electronic products, for example. Furthermore, because the length of the wiring structures 112/122 between the packaged semiconductor devices 140, 140a, 140b, 140c, 140d, and 140e is minimized, lower power consumption is achieved.

In accordance with some embodiments of the present disclosure, a method of packaging semiconductor devices includes forming a plurality of first contact pads on a carrier, forming a wiring structure over the plurality of first contact pads, and forming a plurality of second contact pads over the wiring structure. A first packaged semiconductor device is coupled to a first set of the plurality of second contact pads, and a second packaged semiconductor device is coupled to a second set of the plurality of second contact pads. The second packaged semiconductor device comprises a different package type than the first packaged semiconductor device. The carrier is removed.

In accordance with other embodiments, a method of packaging semiconductor devices includes forming a first seed layer over a carrier, and forming a first insulating material over the first seed layer. The first insulating material is patterned to define a pattern for a plurality of first contact pads, and a first conductive material is plated on the first seed layer to form the plurality of first contact pads. The method includes forming a second seed layer over the first conductive material and the first insulating material, forming a first layer of photoresist over the second seed layer, and patterning the first layer of photoresist to define a wiring structure. A second conductive material is plated on exposed portions of the second seed layer, and the first layer of photoresist is removed. A second insulating material is formed over the second conductive material and the first insulating material, and the second insulating material is patterned to define a pattern for a plurality of second contact pads. A third seed layer is formed over the patterned second insulating material and exposed portions of the second conductive material, and a second layer of photoresist is formed over the third seed layer. The method includes patterning the second layer of photoresist to further define the pattern for the plurality of second contact pads, and plating a third conductive material on exposed portions of the third seed layer to form the plurality of second contact pads. A first packaged semiconductor device is coupled to a first set of the plurality of second contact pads, and a second packaged semiconductor device is coupled to a second set of the plurality of second contact pads, the second packaged semiconductor device comprising a different package type than the first packaged semiconductor device. The carrier is removed.

In accordance with other embodiments, a packaged semiconductor device includes an RDL including a plurality of insulating material layers and a wiring structure disposed in the plurality of insulating material layers. The RDL has a first side and a second side opposite the first side. A plurality of first contact pads is disposed on the first side of the RDL, and a plurality of second contact pads is disposed on the second side of the RDL. A first packaged semiconductor device is coupled to a first set of the plurality of second contact pads, and a second packaged semiconductor device is coupled to a second set of the plurality of second contact pads, the second packaged semiconductor device comprising a different package type than the first packaged semiconductor device. A molding compound is disposed over the first packaged semiconductor device, the second packaged semiconductor device, and the RDL. A conductive ball is disposed on each of the plurality of first contact pads.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of packaging semiconductor devices, the method comprising:

forming a plurality of first contact pads on a first seed layer disposed over a carrier;

forming a wiring structure over the plurality of first contact pads;

forming a second seed layer over and electrically coupled to the wiring structure;

forming a plurality of second contact pads over and electrically coupled to second seed layer, the second contact pads comprising a layer of solder and a layer of nickel overlying the layer of solder, the layer of nickel physically contacting both the layer of solder and the second seed layer, the layer of solder physically contacting the second seed layer, a lowermost surface of the second seed layer being lower than a lowermost surface of the layer of solder, and an uppermost surface of the second seed layer is higher than an uppermost surface of the layer of solder;

coupling a first packaged semiconductor device to a first set of the plurality of second contact pads;

coupling a second packaged semiconductor device to a second set of the plurality of second contact pads, the second packaged semiconductor device comprising a different package type than the first packaged semiconductor device, the second packaged semiconductor device comprising an integrated circuit;

encapsulating the first packaged semiconductor device, including a topmost surface of the first packaged semiconductor device, in a molding compound and partially encapsulating the second packaged semiconductor device in the molding compound, wherein a topmost surface of the second packaged semiconductor device is uncovered by the molding compound; and removing the carrier and the first seed layer.

2. The method according to claim 1, further comprising forming a conductive ball on each of the plurality of first contact pads.

3. The method according to claim 1, further comprising after encapsulating the first packaged semiconductor device, reducing a thickness of the molding compound.

4. The method according to claim 1, wherein forming the plurality of first contact pads comprises forming the first seed layer over the carrier, forming a first insulating material over the first seed layer, patterning the first insulating material, and plating a first conductive material on the first seed layer.

5. The method according to claim 4, wherein forming the wiring structure comprises forming a redistribution layer (RDL).

6. The method according to claim 5, wherein forming the RDL comprises forming a third seed layer over the patterned first insulating material and the first conductive material, plating a second conductive material over portions of the third seed layer, removing portions of the third seed layer, and forming a second insulating material over the first insulating material and the second conductive material.

7. The method according to claim 6, wherein forming the plurality of second contact pads comprises forming the plurality of second contact pads over portions of the second conductive material.

8. A method of packaging semiconductor devices, the method comprising:

forming a first seed layer on a carrier;
forming a first insulating material over the first seed layer;
patterning the first insulating material to define a pattern for a plurality of first contact pads;
plating a first conductive material on the first seed layer to form the plurality of first contact pads;
forming a second seed layer over and physically contacting the first conductive material and the first insulating material;
forming a first layer of photoresist over the second seed layer;
patterning the first layer of photoresist to define a wiring structure;
plating a second conductive material on exposed portions of the second seed layer to forming the wiring structure, the wiring structure comprising:
a first portion extending through the first insulating material to the first plurality of contact pads; and
a second portion extending over a top surface of the first insulating material, wherein the plating the second conductive material is a single, continuous plating process to form the first and second portions of the wiring structure, a lowermost surface of a top surface of the wiring structure being higher than a topmost surface of the top surface of the first insulating material;
removing the first layer of photoresist;
forming a second insulating material over the second conductive material and the first insulating material;
patterning the second insulating material to define a pattern for a plurality of second contact pads;
forming a third seed layer over the patterned second insulating material and exposed portions of the second conductive material;
forming a second layer of photoresist over the third seed layer;
patterning the second layer of photoresist to further define the pattern for the plurality of second contact pads;
plating a third conductive material on exposed portions of the third seed layer to form the plurality of second contact pads, wherein plating the third conductive material comprises plating solder on the exposed third seed layer, a lowermost surface of the third seed layer is lower than a lowermost surface of the plated solder, and an uppermost surface of the third seed layer is higher than an uppermost surface of the plated solder;
coupling a first packaged semiconductor device to a first set of the plurality of second contact pads;
coupling a second packaged semiconductor device to a second set of the plurality of second contact pads, the second packaged semiconductor device comprising a different package type than the first packaged semiconductor device, the second packaged semiconductor device comprising a device type selected from the group consisting essentially of an integrated circuit, a plurality of integrated circuits, a system-in-a-package (SiP), an SiP module, a microelectromechanical system (MEMS), and combinations thereof, wherein coupling the first packaged semiconductor device and coupling the second packaged semiconductor device comprise reflowing the solder of the third conductive material;
encapsulating the first packaged semiconductor device and the second packaged semiconductor device in a molding compound, a topmost surface of the first packaged semiconductor device being covered by the molding compound and a topmost surface of the second packaged semiconductor device being uncovered by the molding compound;
removing the carrier and the first seed layer to expose the plurality of first contact pads; and
forming solder bumps on the exposed first contact pads.

9. The method according to claim 8, further comprising coupling a plurality of the second packaged semiconductor devices to a plurality of second sets of the second contact pads, wherein each of the plurality of second packaged semiconductor devices comprises a heterogeneous package type with respect to others of the plurality of second packaged semiconductor devices.

10. The method according to claim 8, wherein the first packaged semiconductor device comprises a device type selected from the group consisting essentially of an integrated circuit, a plurality of integrated circuits, a system-in-a-package (SiP), an SiP module, a discrete passive device, a microelectromechanical system (MEMS), a functional module, and combinations thereof.

11. The method according to claim 8, wherein forming the first seed layer comprises forming Ti, wherein plating the first conductive material comprises plating Ni, wherein forming the second seed layer comprises forming TiCu, wherein plating the second conductive material comprises plating Cu, or wherein forming the third seed layer comprises forming TiCu.

12. A method of packaging semiconductor devices, the method comprising:

forming a plurality of first contact pads in a first plurality of openings of a first insulating material disposed over a first seed layer, the first seed layer disposed over a carrier, wherein the plurality of first contact pads contact the first seed layer;

forming a wiring structure over the plurality of first contact pads and over a surface of the first insulating material facing away from the carrier;

forming a second insulating material over the wiring structure, the second insulating material having a second plurality of openings exposing portions of the wiring structure;

forming a second seed layer in the second plurality of openings and over the second insulating material;

forming a layer of solder on the second seed layer in the second plurality of openings and forming a layer of nickel over the layer of solder to form a plurality of second contact pads in the second plurality of openings, the layer of nickel physically contacting the second seed layer and the layer of solder, the layer of solder physically contacting the second seed layer, a lowermost surface of the second seed layer being lower than a lowermost surface of the layer of solder, and an uppermost surface of the second seed layer is higher than an uppermost surface of the layer of solder;

coupling a first packaged semiconductor device to a first set of the plurality of second contact pads, the first packaged semiconductor device comprising a device type selected from the group consisting essentially of an integrated circuit, a plurality of integrated circuits, a system-in-a-package (SiP), an SiP module, a microelectromechanical system (MEMS), and combinations thereof;

coupling a second packaged semiconductor device to a second set of the plurality of second contact pads, the second packaged semiconductor device comprising a different package type than the first packaged semiconductor device;

encapsulating the first packaged semiconductor device and the second packaged semiconductor device in a molding compound;

removing a portion of the molding compound so that a topmost surface of the molding compound is level with a topmost surface of the first packaged semiconductor device while remaining above a topmost surface of the second packaged semiconductor device; and removing the carrier and the first seed layer.

13. The method according to claim 12, wherein the forming the plurality of first contact pads in the first plurality of openings of the first insulating material disposed over the carrier comprises:

forming the first seed layer over the carrier;

forming the first insulating material over the first seed layer;

forming the first plurality of openings in the first insulating material, the first plurality of openings exposing portions of the first seed layer; and plating a first conductive material in the first plurality of openings.

14. The method according to claim 13, wherein the forming the first seed layer comprises forming Ti, and wherein the plating the first conductive material comprises plating Ni.

15. The method according to claim 12, further comprising:

after the removing, forming a conductive interconnect on each of the plurality of first contact pads on a surface of the plurality of first contact pads facing away from the wiring structure.

16. The method according to claim 12, further comprising forming a molding compound over the first packaged semiconductor device, the second packaged semiconductor device, and the wiring structure.

17. The method according to claim 12, wherein the second packaged semiconductor device comprises a device type selected from the group consisting essentially of an integrated circuit, a plurality of integrated circuits, a system-in-a-package (SiP), an SiP module, a discrete passive device, a microelectromechanical system (MEMS), a functional module, and combinations thereof.

18. The method according to claim 12, further comprising coupling a plurality of the second packaged semiconductor devices to a plurality of second sets of the second contact pads, wherein each of the plurality of second packaged semiconductor devices comprises a heterogeneous package type with respect to others of the plurality of second packaged semiconductor devices.

19. The method of claim 12 further comprising:

plating nickel over the solder of the plurality of second contact pads.

20. The method of claim 8, wherein plating the third conductive material further comprises plating nickel over the solder, the nickel physically contacting the third seed layer and the solder, the solder physically contacting the third seed layer.

* * * * *